(12) United States Patent
Shrivastava et al.

(10) Patent No.: US 11,738,453 B2
(45) Date of Patent: Aug. 29, 2023

(54) INTEGRATION OF HETEROGENEOUS MODELS INTO ROBOTIC PROCESS AUTOMATION WORKFLOWS

(71) Applicant: UiPath, Inc., New York, NY (US)

(72) Inventors: Shashank Shrivastava, Bangalore (IN); Anton McGonnell, Seattle, WA (US)

(73) Assignee: UiPath, Inc., New York, NY (US)

( * ) Notice: Subject to any disclaimer, the term of this patent is extended or adjusted under 35 U.S.C. 154(b) by 731 days.

(21) Appl. No.: 16/710,027

(22) Filed: Dec. 11, 2019

(65) Prior Publication Data

US 2021/0107141 A1  Apr. 15, 2021

(51) Int. Cl.
| | |
|---|---|
| B25J 9/16 | (2006.01) |
| G06F 8/60 | (2018.01) |
| G06N 20/00 | (2019.01) |
| G06F 30/27 | (2020.01) |
| H04L 41/16 | (2022.01) |
| G06F 8/71 | (2018.01) |

(52) U.S. Cl.
CPC .......... B25J 9/163 (2013.01); G06F 8/60 (2013.01); G06F 8/71 (2013.01); G06F 30/27 (2020.01); G06N 20/00 (2019.01); H04L 41/16 (2013.01)

(58) Field of Classification Search
CPC .... B25J 9/163; G06F 8/60; G06F 8/71; G06F 30/27; G06N 20/00; H04L 41/16
See application file for complete search history.

(56) References Cited

U.S. PATENT DOCUMENTS

| | | | |
|---|---|---|---|
| 9,503,466 B2 | 11/2016 | Vasseur et al. | |
| 10,354,225 B2 | 7/2019 | Sharma et al. | |
| 2015/0193697 A1* | 7/2015 | Vasseur | H04L 43/0876 |
| | | | 706/12 |

(Continued)

FOREIGN PATENT DOCUMENTS

| | | |
|---|---|---|
| EP | 3467662 A1 | 4/2019 |
| KR | 102010468 B1 | 8/2019 |
| WO | 2021001845 A1 | 1/2021 |

OTHER PUBLICATIONS

Rose et al., "Combining Robotic Process Automation and Machine Learning", Deloitte and SAS, 2019, 10 Pages. (Year: 2019).*

(Continued)

*Primary Examiner* — Austin J Moreau
*Assistant Examiner* — Chhian (Amy) Ling
(74) *Attorney, Agent, or Firm* — LeonardPatel PC; Michael Aristo Leonard, II; Sheetal Suresh Patel

(57) ABSTRACT

Frameworks and techniques for integration of heterogeneous machine learning (ML) models into robotic process automation (RPA) workflows are provided. This may be accomplished via a seamless drag-and-drop interface that allows deployment of ML models into an RPA workflow. Via a framework, these heterogeneous models may be provided by customers, third parties, and/or partners and integrated into the RPA workflow. The framework may provide a straightforward way to deploy machine learning models via a conductor and to manage model versioning and create/retrieve/update/delete (CRUD). The framework may facilitate integration of different models into the RPA workflow through the steps of uploading, validating, publishing, and deploying models.

27 Claims, 8 Drawing Sheets

(56) References Cited

U.S. PATENT DOCUMENTS

| | | | |
|---|---|---|---|
| 2016/0012350 A1 | 1/2016 | Narayanan et al. | |
| 2017/0078336 A1* | 3/2017 | Aluvala | H04L 65/1069 |
| 2017/0178020 A1 | 6/2017 | Duggan et al. | |
| 2017/0228119 A1 | 8/2017 | Hosbettu et al. | |
| 2018/0060759 A1* | 3/2018 | Chu | G06N 20/00 |
| 2018/0197123 A1* | 7/2018 | Parimelazhagan | G06Q 10/0633 |
| 2018/0321918 A1* | 11/2018 | McClory | H04L 63/0281 |
| 2019/0147371 A1 | 5/2019 | Deo et al. | |
| 2019/0188070 A1* | 6/2019 | Das | G06F 11/0706 |
| 2019/0332508 A1* | 10/2019 | Goyal | G06F 11/3414 |
| 2020/0147791 A1* | 5/2020 | Safary | G06N 20/00 |
| 2020/0341970 A1* | 10/2020 | Rodrigues | H04L 51/02 |
| 2020/0371782 A1 | 11/2020 | Baierlein et al. | |
| 2021/0339389 A1* | 11/2021 | Arcand | G06N 5/046 |

OTHER PUBLICATIONS

"Machine Learning (ML) for Robotic Process Automation (RPA)", IPCOM000259995D, Oct. 7, 2019, 7 pages. (Year: 2019).*

"End-to-End Automation Enables Business Transformation", UiPath RebootTMWork, Oct. 21, 2019, 22 Pages (Year: 2019).*

PEGA Community, "Tutorial: Uploading JAR files that contain models to Decision Data rules," available at https://community.pega.com/knowledgebase/articles/decision-management-overview/tutorial-uploading-jar-files-contain-models (last updated Oct. 31, 2018).

Matthew T Henning, "Non-Final Office Action", dated Jun. 16, 2022, U.S. Appl. No. 16/710,049.

Matthew T Henning, "Final Office Action", dated Jan. 11, 2023, U.S. Appl. No. 16/710,049.

Matthew T. Henning, Notice of Allowance issued in U.S. Appl. No. 16/710,049 dated Jun. 13, 2023.

* cited by examiner

INTEGRATION OF HETEROGENEOUS MODELS INTO ROBOTIC PROCESS AUTOMATION WORKFLOWS

CROSS REFERENCE TO RELATED APPLICATION

This application claims the benefit of Indian Patent Application No. 201911041728 filed Oct. 15, 2019. The subject matter of this earlier filed application is hereby incorporated by reference in its entirety.

FIELD

The present invention generally relates to robotic process automation (RPA), and more specifically, to integration of heterogeneous models into RPA workflows.

BACKGROUND

Artificial intelligence (AI) and machine learning (ML), for example, may be beneficial in robotic process automation (RPA) in order to automate steps that are difficult to define, have high variability, and require a probabilistic approach. However, ML in RPA currently lacks a practical operationalization vehicle. More specifically, ML should be seamlessly plugged into a business process to provide high velocity ML.

There are three significant barriers that prevent robotic process automation (RPA) and machine learning (ML) from seamlessly working together: operations, technology, and process. From an operations standpoint, the robotic operations center (ROC) and data science teams usually exist independently as silos with different skillsets, focuses, and business priorities. From a technology standpoint, RPA developers use an RPA platform to build, deploy, and manage automations performed by robots. Meanwhile, data scientists use dedicated ML modeling tools. Currently, publishing ML models as an application programming interface (API) is done by via platforms such as Azure®, Google®, and Amazon®. The ML model is exposed over HTTP. However, the user is required to write code to consume the API.

These tools, pipelines, and technologies are currently disconnected, and RPA and ML are managed as separate processes. When trying to incorporate ML models, the ROC does not know whether the model is producing the correct output or whether the model has been updated. Also, the data science team does not know whether the models are being used correctly and how useful the models are. For instance, data scientists do not currently have a straightforward mechanism to pass a schema definition to an RPA developer for inclusion in a workflow. It is also not known whether an endpoint for the RPA developer to deploy the ML model will change, or what other tasks the ML model is being used for. Furthermore, it is not known by the data scientist what caused a model to break (e.g., the data scientist may not know whether the endpoint is reachable) or how to get the model retrained and update the workflow if the input data changes. This creates a fundamental disconnect between RPA and ML. Accordingly, an improved approach to integration of RPA and ML may be beneficial.

SUMMARY

Certain embodiments of the present invention may provide solutions to the problems and needs in the art that have not yet been fully identified, appreciated, or solved by current RPA technologies. For example, some embodiments of the present invention pertain to integration of heterogeneous models into RPA workflows.

In an embodiment, a computer program is embodied on a non-transitory computer-readable medium. The program is configured to cause at least one processor to receive an ML model from a conductor application and perform validation on the ML model. When validation of the ML model succeeds, the program is configured to cause the at least one processor to upload the ML model into storage and deploy the ML model for use by RPA robots. When validation of the model fails, the program is configured to cause the at least one processor to reject the ML model.

In another embodiment, a computer-implemented method includes performing validation on an ML model, by a computing system. When validation of the ML model succeeds, the computer-implemented method also includes uploading the ML model into storage, by the computing system, and deploying the ML model, by the computing system, for use by RPA robots.

In yet another embodiment, a system includes memory storing computer program instructions and at least one processor configured to execute the computer program instructions. The instructions are configured to cause the at least one processor to receive an ML model from a conductor application and perform validation on the ML model. When validation of the ML model succeeds, the instructions are also configured to cause the at least one processor to upload the ML model into storage, deploy the ML model for use by RPA robots, and publish the ML model by exposing the ML model as a service via a REST API that the RPA robots call during execution.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
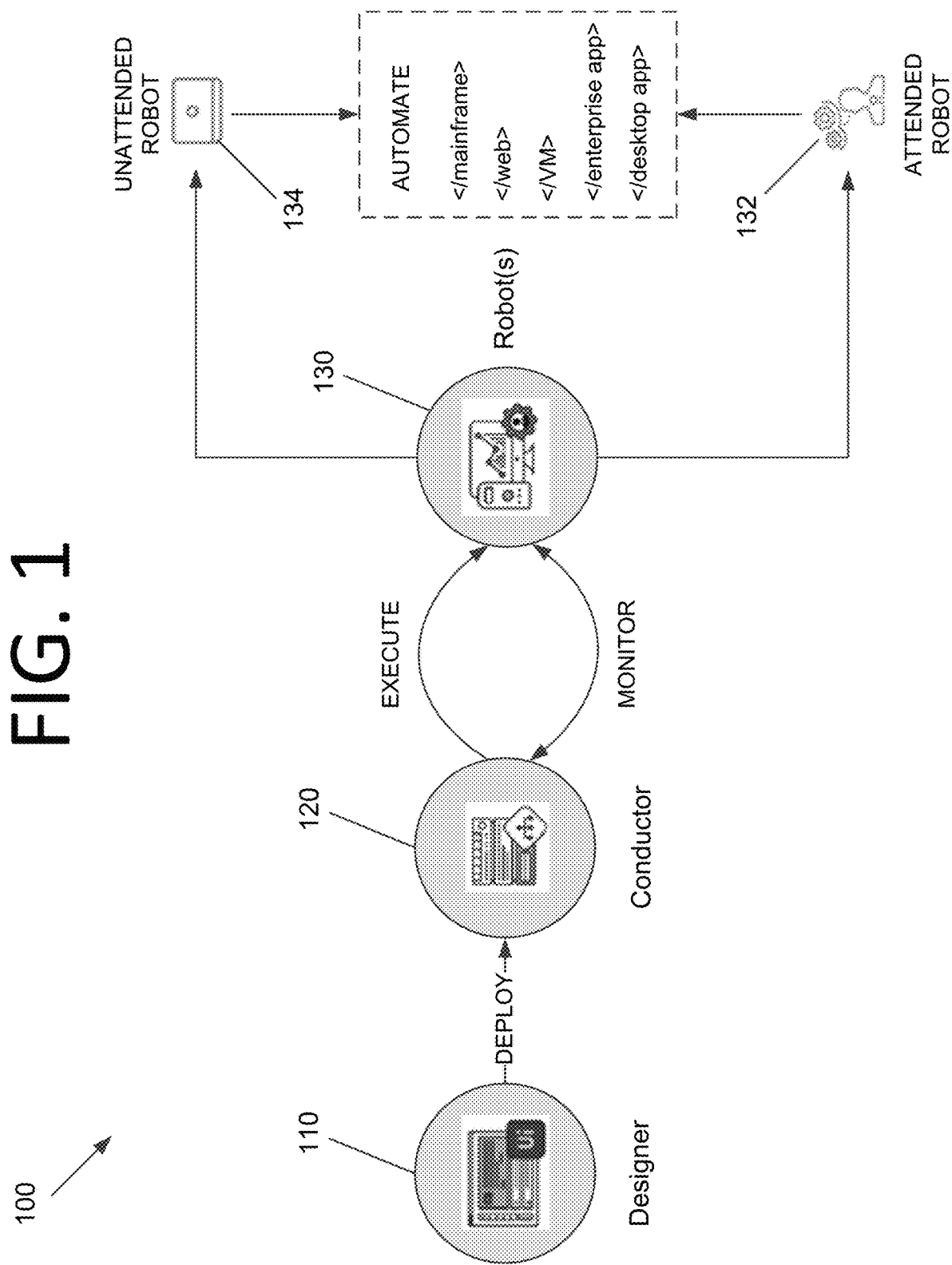
FIG. 1 is an architectural diagram illustrating an RPA system, according to an embodiment of the present invention.

Some embodiments pertain to integration of heterogeneous models into RPA workflows. In certain embodiments, this may be accomplished via a seamless drag-and-drop interface that allows deployment of ML models into an RPA workflow. Via a framework, these heterogeneous models may be provided by customers, third parties, and/or partners and integrated into the RPA workflow. The framework may provide a straightforward way to deploy machine learning models via a conductor and to manage model versioning and create/retrieve/update/delete (CRUD). Model consumption may occur via input/output calls to machine learning (ML) deployments within the RPA workflow. In some embodiments, the framework facilitates integration of different models into the RPA workflow through the steps of uploading, validating, publishing, and deploying models.

Uploading Models

In some embodiments, software developers and data scientists can build preconfigured components that can be used in their respective environments via a single designer platform (e.g., UiPath Studio X™). When an RPA developer builds an RPA workflow or a data engineer builds an ML data pipeline (e.g., using UiPath AI Studio™) the ML data pipeline may be uploaded to a designer environment. The ML data pipeline may include packaged pieces of code that are executed in a predefined order to process the input and produce the desired output. This output may then be sent to deployed ML models for processing. In some embodiments, uploading may occur via: (1) a browser/client-side upload, where the framework provides a signed, secured, and temporary universal resource locator (URL) that is valid for a certain period of time; or (2) a script-based upload, where the conductor user interface (UI) provides a script for uploading the model to cloud storage using a signed URL directly where the user runs the script on a local machine, and the script then uploads the model to cloud storage using a resumable protocol.

Validation of Models

The uploaded models may be stored in the cloud in a desired configuration, and data validation may be performed on top of the package.

Model Publishing

After successful validation, wrapper code may be built around the model to create a model container. The models can be called in some embodiments via REST APIs (which may not be visible to user), which may be exposed as service that can be consumed via a hypertext transfer protocol (HTTP) call.

Model Deployment

The framework may allow model consumption through the activities within the RPA workflows.

In some embodiments, during runtime, a customer accesses a conductor application and enables an AI fabric tenant. As used herein, a "tenant" is a group of users that are related and can have shared access to the AI fabric, which is a multi-tenant service in some embodiments. Enabling tenants is the first step to register information about the tenant and to provision resources for users in that tenant in some embodiments.

Once the AI fabric is enabled, a user (e.g., an ML engineer or a process engineer) may log into the conductor and upload a trained model or select an uploaded model to deploy. The conductor may include a section where ML packages and ML skills are displayed. ML packages may be brought by customers and may include model code, runtime dependency information, etc., as a zip file, for example.

The framework may allow the user to upload the model, perform CRUD operations, deploy the model, and consume the model at runtime. The uploaded models may be stored in the cloud and data validation may be performed on top of the package. The customer may convert the model into a predefined format, upload the model to the cloud, have the model validated, and then deploy the model. The user can upload a model and use it as an RPA workflow activity (API) in some embodiments.

At design time, wrapper codes may be written around the models and kept in a container. The models may be called by REST APIs in some embodiments and be exposed as service that can be consumed via an HTTP call. These models may then be accessed from the designer interface through an activity.

This interaction with AI fabric may be accomplished via a proxy service that is loosely coupled with the conductor application. The proxy service may tunnel incoming requests to the AI fabric for the purpose of authentication, authorization, and audit. A conductor controller may send end user requests through the proxy, and the activity may also call the AI fabric through the proxy. At runtime, the robot may consume the configured model services via this proxy service as well.

FIG. 1 is an architectural diagram illustrating an RPA system 100, according to an embodiment of the present invention. RPA system 100 includes a designer 110 that allows a developer to design and implement workflows. Designer 110 may provide a solution for application integration, as well as automating third-party applications, administrative Information Technology (IT) tasks, and business IT processes. Designer 110 may facilitate development of an automation project, which is a graphical representation of a business process. Simply put, designer 110 facilitates the development and deployment of workflows and robots.

The automation project enables automation of rule-based processes by giving the developer control of the execution order and the relationship between a custom set of steps developed in a workflow, defined herein as "activities." One commercial example of an embodiment of designer 110 is UiPath Studio™. Each activity may include an action, such as clicking a button, reading a file, writing to a log panel, etc. In some embodiments, workflows may be nested or embedded.

Some types of workflows may include, but are not limited to, sequences, flowcharts, Finite State Machines (FSMs), and/or global exception handlers. Sequences may be particularly suitable for linear processes, enabling flow from one activity to another without cluttering a workflow. Flowcharts may be particularly suitable to more complex business logic, enabling integration of decisions and connection of activities in a more diverse manner through multiple branching logic operators. FSMs may be particularly suitable for large workflows. FSMs may use a finite number of states in their execution, which are triggered by a condition (i.e., transition) or an activity. Global exception handlers may be particularly suitable for determining workflow behavior when encountering an execution error and for debugging processes.

Once a workflow is developed in designer 110, execution of business processes is orchestrated by conductor 120, which orchestrates one or more robots 130 that execute the workflows developed in designer 110. One commercial example of an embodiment of conductor 120 is UiPath Orchestrator™. Conductor 120 facilitates management of the creation, monitoring, and deployment of resources in an environment. Conductor 120 may act as an integration point with third-party solutions and applications.

Conductor 120 may manage a fleet of robots 130, connecting and executing robots 130 from a centralized point. Types of robots 130 that may be managed include, but are not limited to, attended robots 132, unattended robots 134, development robots (similar to unattended robots 134, but used for development and testing purposes), and nonproduction robots (similar to attended robots 132, but used for development and testing purposes). Attended robots 132 are triggered by user events and operate alongside a human on the same computing system. Attended robots 132 may be used with conductor 120 for a centralized process deployment and logging medium. Attended robots 132 may help the human user accomplish various tasks, and may be triggered by user events. In some embodiments, processes cannot be started from conductor 120 on this type of robot and/or they cannot run under a locked screen. In certain embodiments, attended robots 132 can only be started from a robot tray or from a command prompt. Attended robots 132 should run under human supervision in some embodiments.

Unattended robots 134 run unattended in virtual environments and can automate many processes. Unattended robots 134 may be responsible for remote execution, monitoring, scheduling, and providing support for work queues. Debugging for all robot types may be run in designer 110 in some embodiments. Both attended and unattended robots may automate various systems and applications including, but not limited to, mainframes, web applications, VMs, enterprise applications (e.g., those produced by SAP®, SalesForce®, Oracle®, etc.), and computing system applications (e.g., desktop and laptop applications, mobile device applications, wearable computer applications, etc.).

Conductor 120 may have various capabilities including, but not limited to, provisioning, deployment, configuration, queueing, monitoring, logging, and/or providing interconnectivity. Provisioning may include creating and maintenance of connections between robots 130 and conductor 120 (e.g., a web application). Deployment may include assuring the correct delivery of package versions to assigned robots 130 for execution. Configuration may include maintenance and delivery of robot environments and process configurations. Queueing may include providing management of queues and queue items. Monitoring may include keeping track of robot identification data and maintaining user permissions. Logging may include storing and indexing logs to a database (e.g., an SQL database) and/or another storage mechanism (e.g., ElasticSearch®, which provides the ability to store and quickly query large datasets). Conductor 120 may provide interconnectivity by acting as the centralized point of communication for third-party solutions and/or applications.

Robots 130 are execution agents that run workflows built in designer 110. One commercial example of some embodiments of robot(s) 130 is UiPath Robots™. In some embodiments, robots 130 install the Microsoft Windows® Service Control Manager (SCM)-managed service by default. As a result, such robots 130 can open interactive Windows® sessions under the local system account, and have the rights of a Windows® service.

In some embodiments, robots 130 can be installed in a user mode. For such robots 130, this means they have the same rights as the user under which a given robot 130 has been installed. This feature may also be available for High Density (HD) robots, which ensure full utilization of each machine at its maximum potential. In some embodiments, any type of robot 130 may be configured in an HD environment.

Robots 130 in some embodiments are split into several components, each being dedicated to a particular automation task. The robot components in some embodiments include, but are not limited to, SCM-managed robot services, user mode robot services, executors, agents, and command line. SCM-managed robot services manage and monitor Windows® sessions and act as a proxy between conductor 120 and the execution hosts (i.e., the computing systems on which robots 130 are executed). These services are trusted with and manage the credentials for robots 130. A console application is launched by the SCM under the local system.

User mode robot services in some embodiments manage and monitor Windows® sessions and act as a proxy between conductor 120 and the execution hosts. User mode robot services may be trusted with and manage the credentials for robots 130. A Windows® application may automatically be launched if the SCM-managed robot service is not installed.

Executors may run given jobs under a Windows® session (i.e., they may execute workflows. Executors may be aware of per-monitor dots per inch (DPI) settings. Agents may be Windows® Presentation Foundation (WPF) applications that display the available jobs in the system tray window. Agents may be a client of the service. Agents may request to start or stop jobs and change settings. The command line is a client of the service. The command line is a console application that can request to start jobs and waits for their output.

Having components of robots 130 split as explained above helps developers, support users, and computing systems more easily run, identify, and track what each component is executing. Special behaviors may be configured per component this way, such as setting up different firewall rules for the executor and the service. The executor may always be aware of DPI settings per monitor in some embodiments. As a result, workflows may be executed at any DPI, regardless of the configuration of the computing system on which they were created. Projects from designer 110 may also be independent of browser zoom level in some embodiments. For applications that are DPI-unaware or intentionally marked as unaware, DPI may be disabled in some embodiments.

Figure 2:
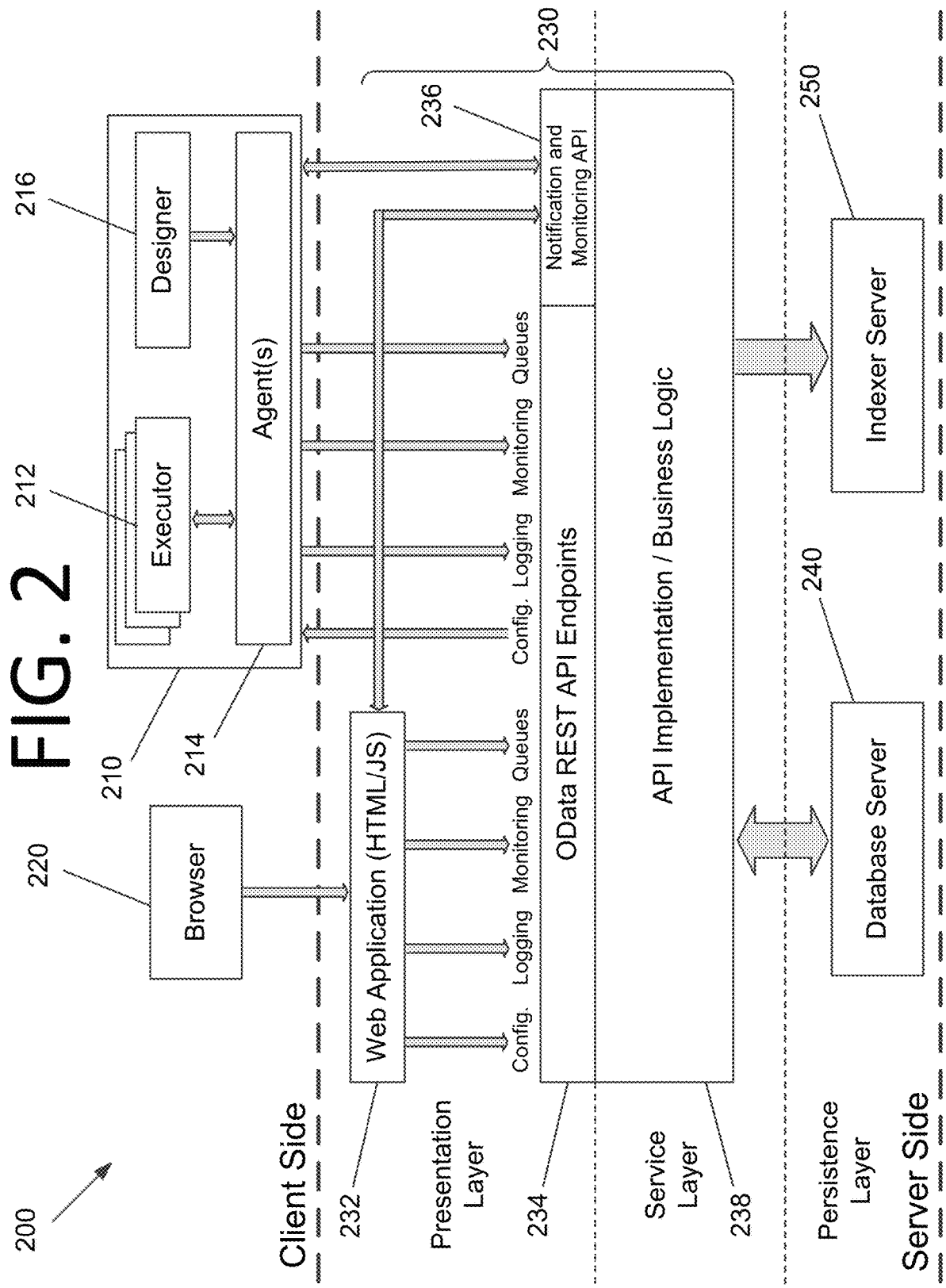
FIG. 2 is an architectural diagram illustrating a deployed RPA system, according to an embodiment of the present invention.

FIG. 2 is an architectural diagram illustrating a deployed RPA system 200, according to an embodiment of the present invention. In some embodiments, RPA system 200 may be, or may be a part of, RPA system 100 of FIG. 1. It should be noted that the client side, the server side, or both, may include any desired number of computing systems without deviating from the scope of the invention. On the client side, a robot application 210 includes executors 212, an agent 214, and a designer 216. However, in some embodiments, designer 216 may not be running on computing system 210. Executors 212 are running processes. Several business projects may run simultaneously, as shown in FIG. 2. Agent 214 (e.g., a Windows® service) is the single point of contact for all executors 212 in this embodiment. All messages in this embodiment are logged into conductor 230, which processes them further via database server 240, indexer server 250, or both. As discussed above with respect to FIG. 1, executors 212 may be robot components.

In some embodiments, a robot represents an association between a machine name and a username. The robot may manage multiple executors at the same time. On computing systems that support multiple interactive sessions running simultaneously (e.g., Windows® Server 2012), multiple robots may be running at the same time, each in a separate Windows® session using a unique username. This is referred to as HD robots above.

Agent 214 is also responsible for sending the status of the robot (e.g., periodically sending a "heartbeat" message indicating that the robot is still functioning) and downloading the required version of the package to be executed. The communication between agent 214 and conductor 230 is always initiated by agent 214 in some embodiments. In the notification scenario, agent 214 may open a WebSocket channel that is later used by conductor 230 to send commands to the robot (e.g., start, stop, etc.).

On the server side, a presentation layer (web application 232, Open Data Protocol (OData) Representative State Transfer (REST) Application Programming Interface (API) endpoints 234, and notification and monitoring 236), a service layer (API implementation/business logic 238), and a persistence layer (database server 240 and indexer server 250) are included. Conductor 230 includes web application 232, OData REST API endpoints 234, notification and monitoring 236, and API implementation/business logic 238. In some embodiments, most actions that a user performs in the interface of conductor 220 (e.g., via browser 220) are performed by calling various APIs. Such actions may include, but are not limited to, starting jobs on robots, adding/removing data in queues, scheduling jobs to run unattended, etc. without deviating from the scope of the invention. Web application 232 is the visual layer of the server platform. In this embodiment, web application 232 uses Hypertext Markup Language (HTML) and JavaScript (JS). However, any desired markup languages, script languages, or any other formats may be used without deviating from the scope of the invention. The user interacts with web pages from web application 232 via browser 220 in this embodiment in order to perform various actions to control conductor 230. For instance, the user may create robot groups, assign packages to the robots, analyze logs per robot and/or per process, start and stop robots, etc.

In addition to web application 232, conductor 230 also includes service layer that exposes OData REST API endpoints 234. However, other endpoints may be included without deviating from the scope of the invention. The REST API is consumed by both web application 232 and agent 214. Agent 214 is the supervisor of one or more robots on the client computer in this embodiment.

The REST API in this embodiment covers configuration, logging, monitoring, and queueing functionality. The configuration endpoints may be used to define and configure application users, permissions, robots, assets, releases, and environments in some embodiments. Logging REST endpoints may be used to log different information, such as errors, explicit messages sent by the robots, and other environment-specific information, for instance. Deployment REST endpoints may be used by the robots to query the package version that should be executed if the start job command is used in conductor 230. Queueing REST endpoints may be responsible for queues and queue item management, such as adding data to a queue, obtaining a transaction from the queue, setting the status of a transaction, etc.

Monitoring REST endpoints may monitor web application 232 and agent 214. Notification and monitoring API 236 may be REST endpoints that are used for registering agent 214, delivering configuration settings to agent 214, and for sending/receiving notifications from the server and agent 214. Notification and monitoring API 236 may also use WebSocket communication in some embodiments.

The persistence layer includes a pair of servers in this embodiment—database server 240 (e.g., a SQL server) and indexer server 250. Database server 240 in this embodiment stores the configurations of the robots, robot groups, associated processes, users, roles, schedules, etc. This information is managed through web application 232 in some embodiments. Database server 240 may manages queues and queue items. In some embodiments, database server 240 may store messages logged by the robots (in addition to or in lieu of indexer server 250).

Indexer server 250, which is optional in some embodiments, stores and indexes the information logged by the robots. In certain embodiments, indexer server 250 may be disabled through configuration settings. In some embodiments, indexer server 250 uses ElasticSearch®, which is an open source project full-text search engine. Messages logged by robots (e.g., using activities like log message or write line) may be sent through the logging REST endpoint(s) to indexer server 250, where they are indexed for future utilization.

Figure 3:
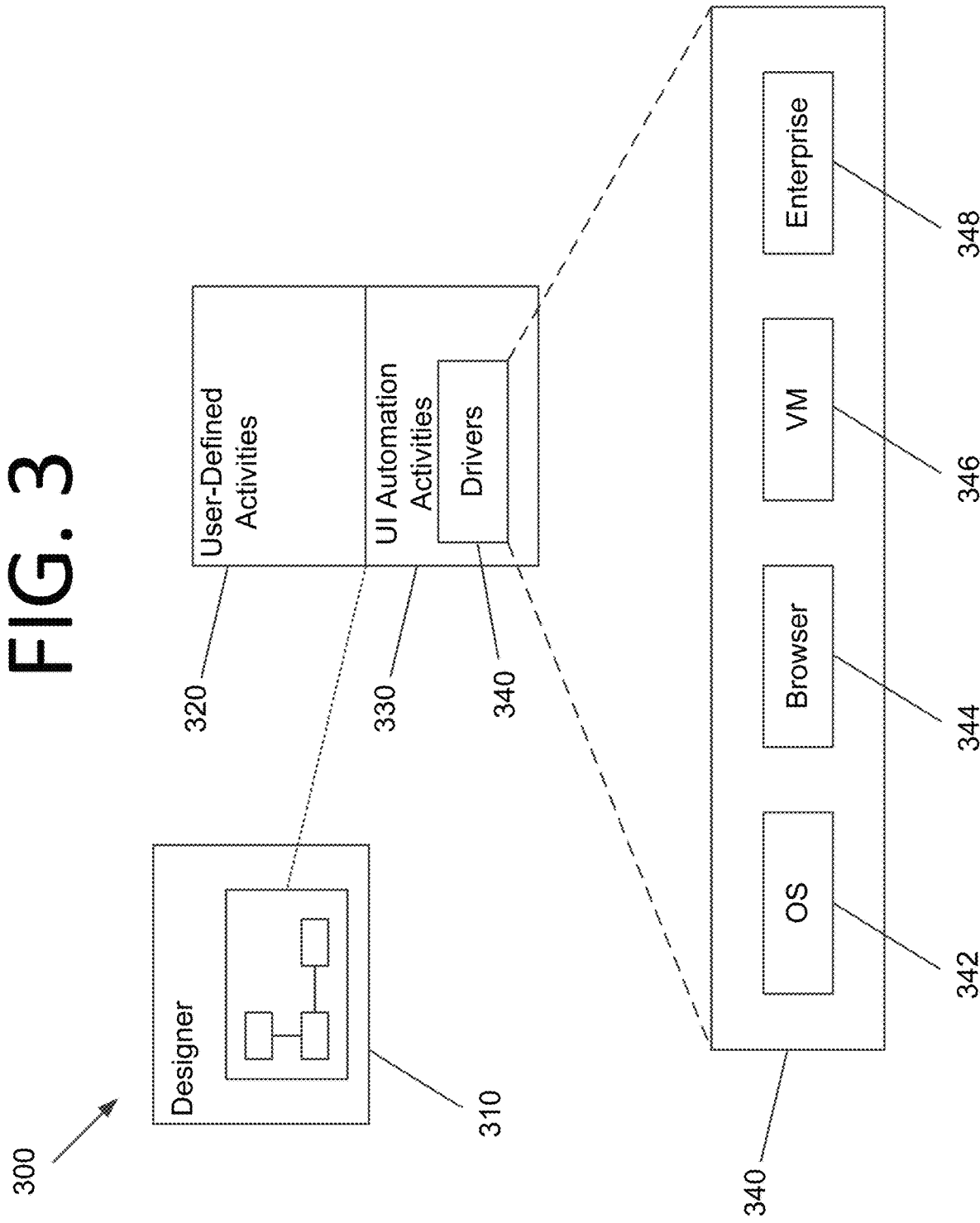
FIG. 3 is an architectural diagram illustrating the relationship between a designer, activities, and drivers, according to an embodiment of the present invention.

FIG. 3 is an architectural diagram illustrating the relationship 300 between a designer 310, activities 320, 330, and drivers 340, according to an embodiment of the present invention. Per the above, a developer uses designer 310 to develop workflows that are executed by robots. Workflows may include user-defined activities 320 and UI automation activities 330. Some embodiments are able to identify non-textual visual components in an image, which is called computer vision (CV) herein. Some CV activities pertaining to such components may include, but are not limited to, click, type, get text, hover, element exists, refresh scope, highlight, etc. Click in some embodiments identifies an element using CV, optical character recognition (OCR), fuzzy text matching, and multi-anchor, for example, and clicks it. Type may identify an element using the above and types in the element. Get text may identify the location of specific text and scan it using OCR. Hover may identify an element and hover over it. Element exists may check whether an element exists on the screen using the techniques described above. In some embodiments, there may be hundreds or even thousands of activities that can be implemented in designer 310. However, any number and/or type of activities may be available without deviating from the scope of the invention.

UI automation activities 330 are a subset of special, lower level activities that are written in lower level code (e.g., CV activities) and facilitate interactions with the screen. UI automation activities 330 facilitate these interactions via drivers 340 that allow the robot to interact with the desired software. For instance, drivers 340 may include OS drivers 342, browser drivers 344, VM drivers 346, enterprise application drivers 348, etc.

Drivers 340 may interact with the OS at a low level looking for hooks, monitoring for keys, etc. They may facilitate integration with Chrome®, IE®, Citrix®, SAP®, etc. For instance, the "click" activity performs the same role in these different applications via drivers 340.

Figure 4:
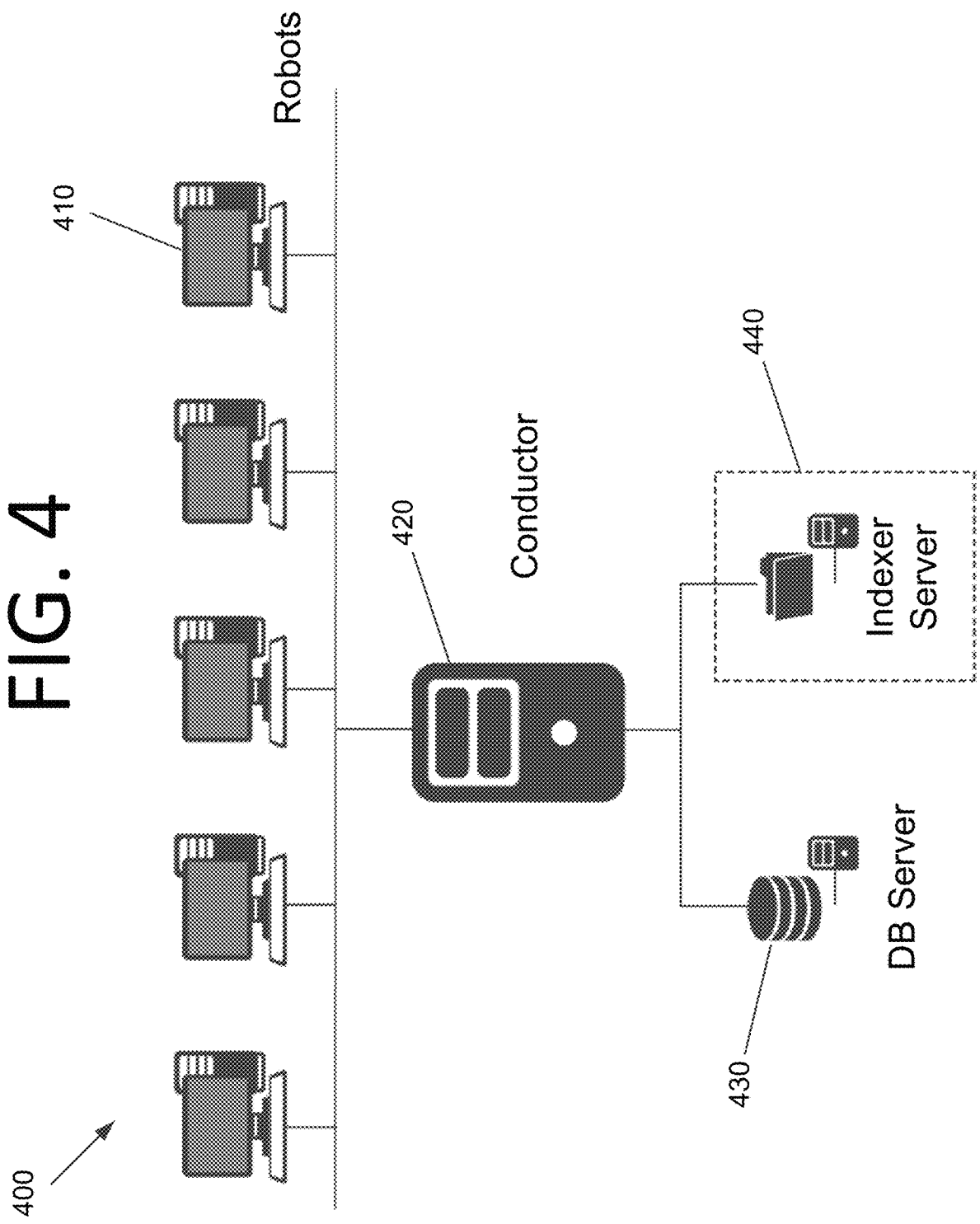
FIG. 4 is an architectural diagram illustrating an RPA system, according to an embodiment of the present invention.

FIG. 4 is an architectural diagram illustrating an RPA system 400, according to an embodiment of the present invention. In some embodiments, RPA system 400 may be or include RPA systems 100 and/or 200 of FIGS. 1 and/or 2. RPA system 400 includes multiple client computing systems 410 running robots. Computing systems 410 are able to communicate with a conductor computing system 420 via a web application running thereon. Conductor computing system 420, in turn, is able to communicate with a database server 430 and an optional indexer server 440.

With respect to FIGS. 1 and 3, it should be noted that while a web application is used in these embodiments, any suitable client/server software may be used without deviating from the scope of the invention. For instance, the conductor may run a server-side application that communicates with non-web-based client software applications on the client computing systems.

Figure 5:
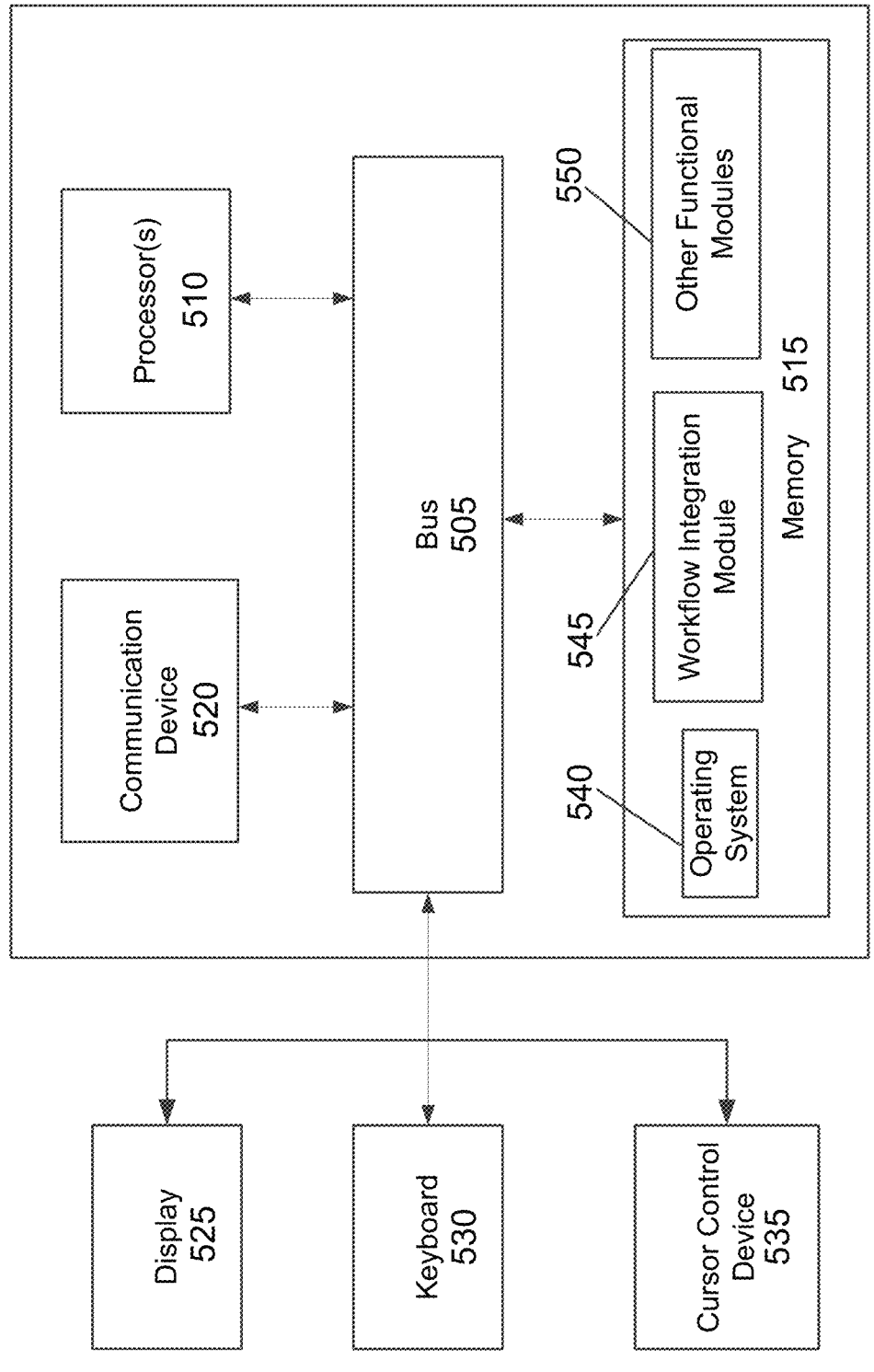
FIG. 5 is an architectural diagram illustrating a computing system configured to integrate heterogeneous models into RPA workflows, according to an embodiment of the present invention.

FIG. 5 is an architectural diagram illustrating a computing system 500 configured to integrate heterogeneous models into RPA workflows, according to an embodiment of the present invention. In some embodiments, computing system 500 may be one or more of the computing systems depicted and/or described herein. Computing system 500 includes a bus 505 or other communication mechanism for communicating information, and processor(s) 510 coupled to bus 505 for processing information. Processor(s) 510 may be any type of general or specific purpose processor, including a Central Processing Unit (CPU), an Application Specific Integrated Circuit (ASIC), a Field Programmable Gate Array (FPGA), a Graphics Processing Unit (GPU), multiple instances thereof, and/or any combination thereof. Processor(s) 510 may also have multiple processing cores, and at least some of the cores may be configured to perform specific functions. Multi-parallel processing may be used in some embodiments. In certain embodiments, at least one of processor(s) 510 may be a neuromorphic circuit that includes processing elements that mimic biological neurons. In some embodiments, neuromorphic circuits may not require the typical components of a Von Neumann computing architecture.

Computing system 500 further includes a memory 515 for storing information and instructions to be executed by processor(s) 510. Memory 515 can be comprised of any combination of Random Access Memory (RAM), Read Only Memory (ROM), flash memory, cache, static storage such as a magnetic or optical disk, or any other types of non-transitory computer-readable media or combinations thereof. Non-transitory computer-readable media may be any available media that can be accessed by processor(s) 510 and may include volatile media, non-volatile media, or both. The media may also be removable, non-removable, or both.

Additionally, computing system 500 includes a communication device 520, such as a transceiver, to provide access to a communications network via a wireless and/or wired connection. In some embodiments, communication device 520 may be configured to use Frequency Division Multiple Access (FDMA), Single Carrier FDMA (SC-FDMA), Time Division Multiple Access (TDMA), Code Division Multiple Access (CDMA), Orthogonal Frequency Division Multiplexing (OFDM), Orthogonal Frequency Division Multiple Access (OFDMA), Global System for Mobile (GSM) communications, General Packet Radio Service (GPRS), Universal Mobile Telecommunications System (UMTS), cdma2000, Wideband CDMA (W-CDMA), High-Speed Downlink Packet Access (HSDPA), High-Speed Uplink Packet Access (HSUPA), High-Speed Packet Access (HSPA), Long Term Evolution (LTE), LTE Advanced (LTE-A), 802.11x, Wi-Fi, Zigbee, Ultra-WideBand (UWB), 802.16x, 802.15, Home Node-B (HnB), Bluetooth, Radio Frequency Identification (RFID), Infrared Data Association (IrDA), Near-Field Communications (NFC), fifth generation (5G), New Radio (NR), any combination thereof, and/or any other currently existing or future-implemented communications standard and/or protocol without deviating from the scope of the invention. In some embodiments, communication device 520 may include one or more antennas that are singular, arrayed, phased, switched, beamforming, beamsteering, a combination thereof, and or any other antenna configuration without deviating from the scope of the invention.

Processor(s) 510 are further coupled via bus 505 to a display 525, such as a plasma display, a Liquid Crystal Display (LCD), a Light Emitting Diode (LED) display, a Field Emission Display (FED), an Organic Light Emitting Diode (OLED) display, a flexible OLED display, a flexible substrate display, a projection display, a 4K display, a high definition display, a Retina® display, an In-Plane Switching (IPS) display, or any other suitable display for displaying information to a user. Display 525 may be configured as a touch (haptic) display, a three dimensional (3D) touch display, a multi-input touch display, a multi-touch display, etc. using resistive, capacitive, surface-acoustic wave (SAW) capacitive, infrared, optical imaging, dispersive signal technology, acoustic pulse recognition, frustrated total internal reflection, etc. Any suitable display device and haptic I/O may be used without deviating from the scope of the invention.

A keyboard 530 and a cursor control device 535, such as a computer mouse, a touchpad, etc., are further coupled to bus 505 to enable a user to interface with computing system. However, in certain embodiments, a physical keyboard and mouse may not be present, and the user may interact with the device solely through display 525 and/or a touchpad (not shown). Any type and combination of input devices may be used as a matter of design choice. In certain embodiments, no physical input device and/or display is present. For instance, the user may interact with computing system 500 remotely via another computing system in communication therewith, or computing system 500 may operate autonomously.

Memory 515 stores software modules that provide functionality when executed by processor(s) 510. The modules include an operating system 540 for computing system 500. The modules further include a workflow integration module 545 that is configured to perform all or part of the processes described herein or derivatives thereof. Computing system 500 may include one or more additional functional modules 550 that include additional functionality.

One skilled in the art will appreciate that a "system" could be embodied as a server, an embedded computing system, a personal computer, a console, a personal digital assistant (PDA), a cell phone, a tablet computing device, a quantum computing system, or any other suitable computing device, or combination of devices without deviating from the scope of the invention. Presenting the above-described functions as being performed by a "system" is not intended to limit the scope of the present invention in any way, but is intended to provide one example of the many embodiments of the present invention. Indeed, methods, systems, and apparatuses disclosed herein may be implemented in localized and distributed forms consistent with computing technology, including cloud computing systems.

It should be noted that some of the system features described in this specification have been presented as modules, in order to more particularly emphasize their implementation independence. For example, a module may be implemented as a hardware circuit comprising custom very large scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, include one or more physical or logical blocks of computer instructions that may, for instance, be organized as an object, procedure, or function. Nevertheless, the executables of an identified module need not be physically located together, but may include disparate instructions stored in different locations that, when joined logically together, comprise the module and achieve the stated purpose for the module. Further, modules may be stored on a computer-readable medium, which may be, for instance, a hard disk drive, flash device, RAM, tape, and/or any other such non-transitory computer-readable medium used to store data without deviating from the scope of the invention.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Figure 6:
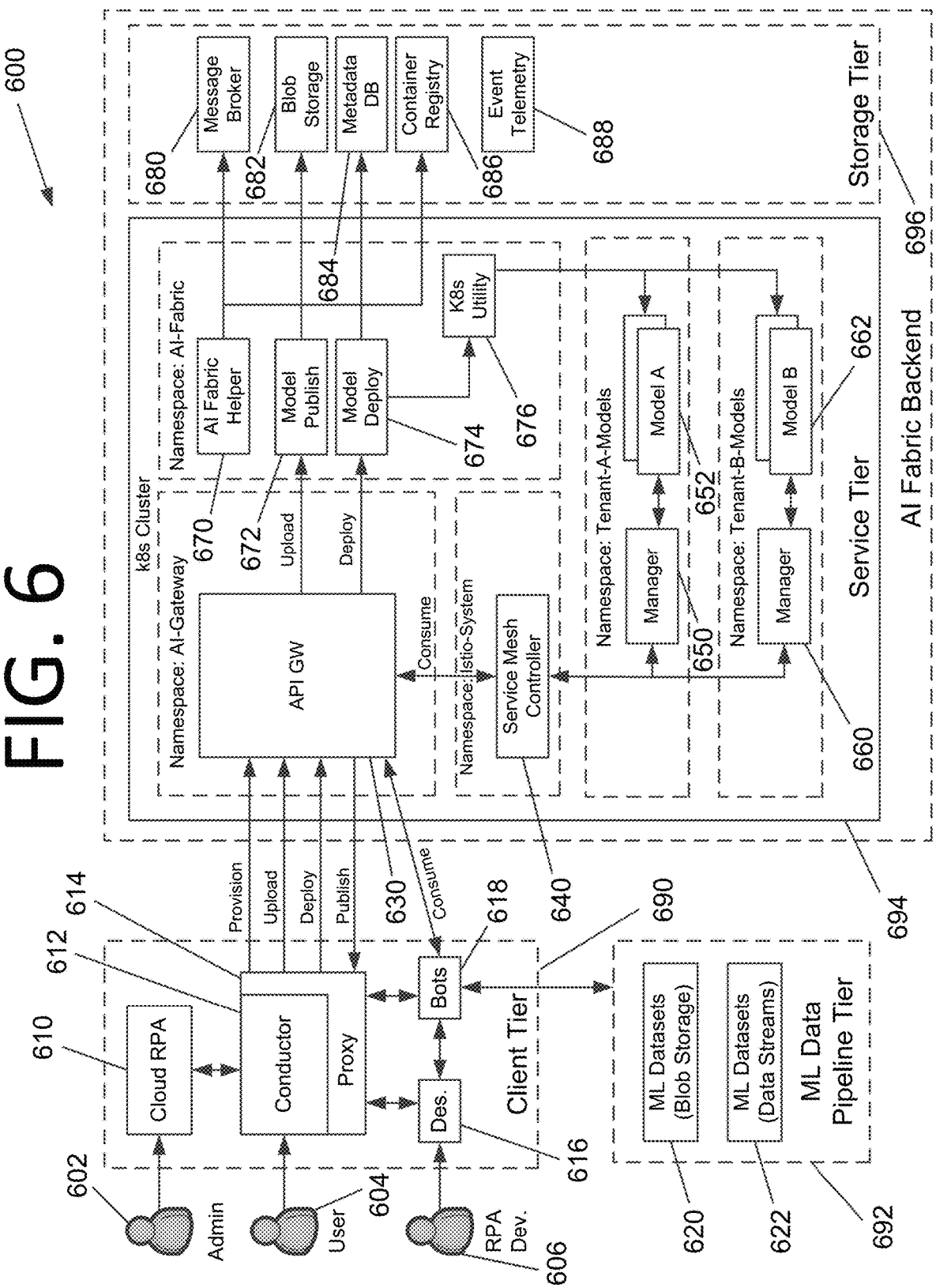
FIG. 6 is an architectural diagram illustrating a framework for integration of heterogeneous models into RPA workflows, according to an embodiment of the present invention.

FIG. 6 is an architectural diagram illustrating a framework 600 for integration of heterogeneous models into RPA workflows, according to an embodiment of the present invention. Framework 600 includes a client tier 690, an ML data pipeline tier 692, a service tier 694, and a storage tier 696. Services components in service tier 694 are hosted inside a Kubernetes (k8s) cluster in this embodiment.

In client tier 690 in this embodiment, cloud RPA 610 is a cloud platform providing software as a service (SaaS) where users, such as user 604, can register and invite other users from the organization to use various services. Administrator 602 may have the ability to enable AI fabric for users in the organization. Administrator 602 may also be able to allocate licenses to tenants/groups under that account. In some embodiments, typical interaction between cloud RPA 610 and the AI fabric will be enabling/disabling AI fabric and allocation of licenses to tenants, which can be used to deploy ML skills.

User 604 (e.g., an ML engineer, a process engineer, or a data scientist) builds preconfigured ML models. An RPA developer 606 develops workflows with a designer 616 (e.g., UiPath Studio™), which are then used to create robots 618. Designer 616 and robots 618 communicate with conductor 612 to fetch configurations and tokens to access the AI Fabric services. Proxy 614 is a layer tasked with ensuring that only authenticated and authorized clients are able to obtain data from conductor 612. In the case that a client is authorized, proxy 614 may provide a token enabling access to service tier 694 while the token is valid. However, in some embodiments, conductor 612 communicates with API gateway 630 directly rather than via proxy 614.

Communication between robots 618 and ML data pipeline tier 692 may be beneficial since this data may be sent to the ML models (e.g., ML models 652 or 662) for processing. This data could be stored as files in blob/file storage 620 or be coming as a stream from data streams 622 and consumed by robots 618. The role of robots 618 in some embodiments is to take these different types of data from different locations and feed it to ML skills, as well as to take the output of the ML skills and push it to desired storages and/or streams.

RPA developer 606 builds an RPA workflow using designer 616, and user 604 builds ML models and uploads them to conductor 612. Provisioning, uploading, deployment, and publication of the ML models occurs via API gateway 630, which receives the ML models from conductor 612 via proxy 614. Robots 618 also consume ML skills from executed models (e.g., models 652, 662) for their operations.

The uploaded models may subsequently be stored by the AI fabric in storage tier 696 in a desired configuration, and data validation may be performed on top of the package. Validation may occur by model publication service 672 prior to uploading the ML model package to blob storage 682 and deploying the ML model. Publishing may include making the ML model available via a REST API. The published model may appear as an option to the RPA developer when adding a corresponding ML activity to a workflow.

Interaction with the AI fabric backend may be accomplished via a proxy service 614 that is loosely coupled with conductor 612. In this context "loosely coupled" means that proxy service 614 does not depend on conductor 612. In other words, proxy service 614 can be decoupled and run independently, if desired. Proxy service 614 may tunnel incoming requests to the AI fabric backend via API gateway 630 for the purpose of authentication, authorization, and audit, for example, which occur in service tier 694.

The services of service tier 694 in this embodiment include an AI fabric helper 670 that provides a collection of internal utility services, such as an async operation, state machine management, storage abstraction and access, etc. Model publish service 672 provides model CRUD and related REST APIs that will be called by a conductor 612. Model deployment service 674 builds images of models (e.g., Docker™ images) with the requisite dependencies, pushes to container registry 686, and interacts with Kubernetes APIs of k8s utility 676 to deploy the containers as ML skills. Per the above, in some embodiments, Docker™ may be used to package the model images.

The storage services of storage tier 696 include a message broker 680, which is a multi-tenant server to provide publish subscribe model-based messaging functionality to support long running and asynchronous tasks. Blob storage 682 provides multi-tenant storage to store models and other dependent files. Metadata database 684 is a multi-tenant server to store metadata regarding models, versions, and deployed skills. Container registry 686 provides a multi-tenant private container registry to store docker images of customer-uploaded models. Event telemetry 688 provides logs and metrics storage for the microservices. Telemetry may be stored for both services in service tier 694 and ML skills deployed by customers.

A service mesh controller 640 (e.g., Istio™) provides service mesh functionality, such as traffic routing rules, monitoring, etc. Managers 650, 660 establish communication with models 652, 662 (e.g., ML skills), which may be wrapped as core images in some embodiments. In certain embodiments, managers 650, 660 are Seldon™.

Once models 652, 662 are validated and deployed, and available to robots 618 as ML skills, when robots 618 reach an activity requiring use of an ML model during their operation, robots 618 send the associated data from ML data pipeline tier 692 to API gateway 630. However, it should be noted that in some embodiments, the data for execution of the ML model may be supplemented by, or come entirely from, a different source than ML data pipeline tier 692.

The data for ML operations for a given robot 618 is routed via service mesh controller 640 to the appropriate manager 650 or 660, which provides the data to the appropriate ML model 652 or 662. Output from ML model 652 or 662 is then sent via manager 650 or 660 back through service mesh controller 640 and API gateway 630 to the appropriate robot 618. The robot then uses this data to complete its ML activity. It should be noted that for certain ML activities, robots 618 may send data to and/or receive data from ML models 652, 662 multiple times.

Figure 7:
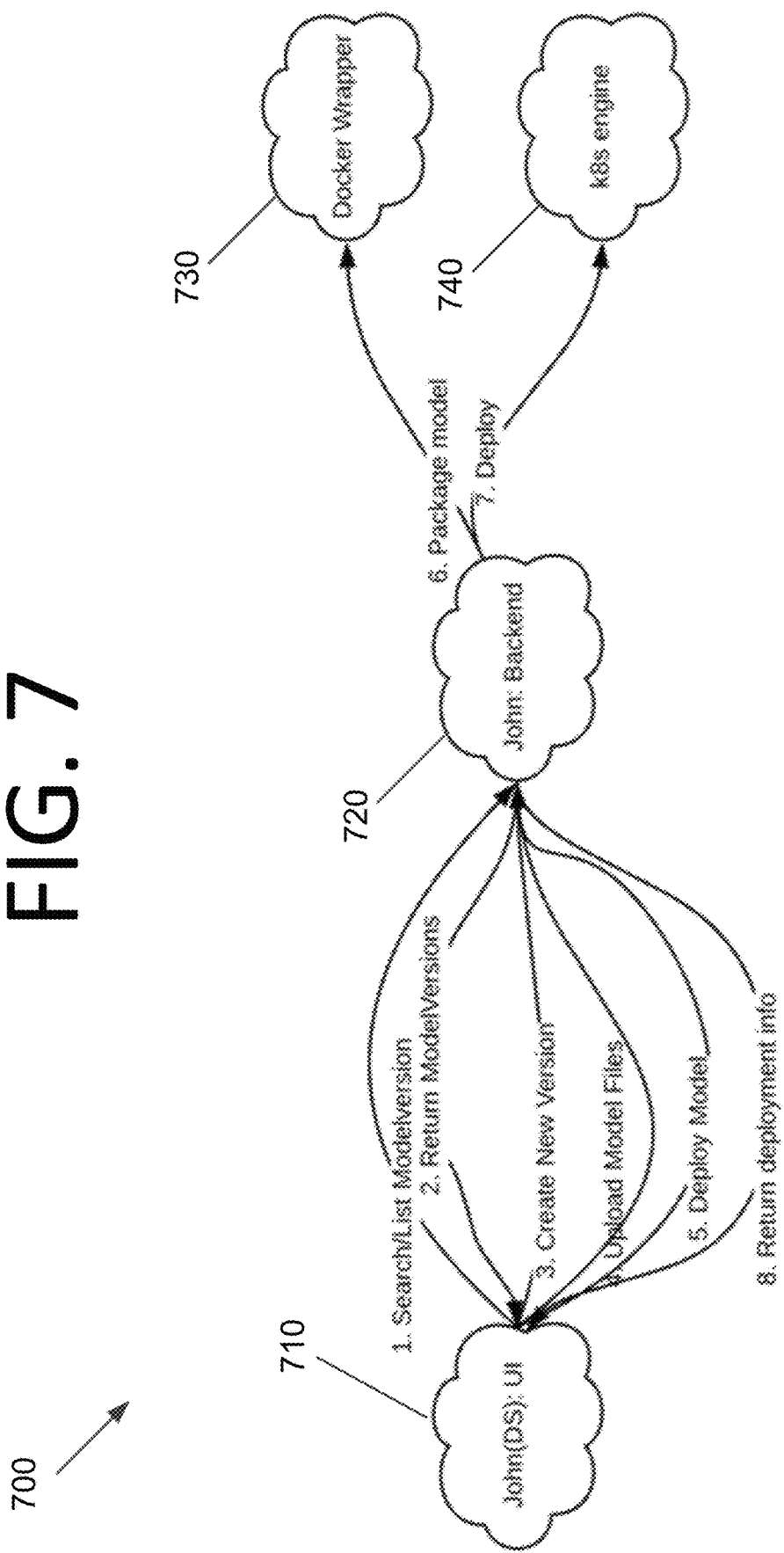
FIG. 7 illustrates a use case for integration of heterogeneous models into RPA workflows, according to an embodiment of the present invention.

FIG. 7 illustrates a use case 700 for integration of heterogeneous models into RPA workflows, according to an embodiment of the present invention. In some embodiments, use case 700 may be implemented via framework 600 of FIG. 6. In use case 700, a user John searches for and lists versions of a model via a user interface 710 (e.g., conductor 612 and proxy 614). An AI fabric backend 720 responds with a list of model versions to be displayed in the user interface. John then creates a new model version, uploads model-related files to backend 720, and asks backend 720 to deploy the new model version. Backend 720 packages the new model version into a Docker™ wrapper 730 to build a container image and push the container image to a registry. Backend 720 then uses a k8s engine 740 to deploy the container image to a k8s cluster. Backend 720 then responds to John with deployment details. John can directly access the list of skills he can use from the designer when he drags-and-drops an ML services activity into his workflow. This activity allows John to call ML skills deployed in his tenant.

Figure 8:
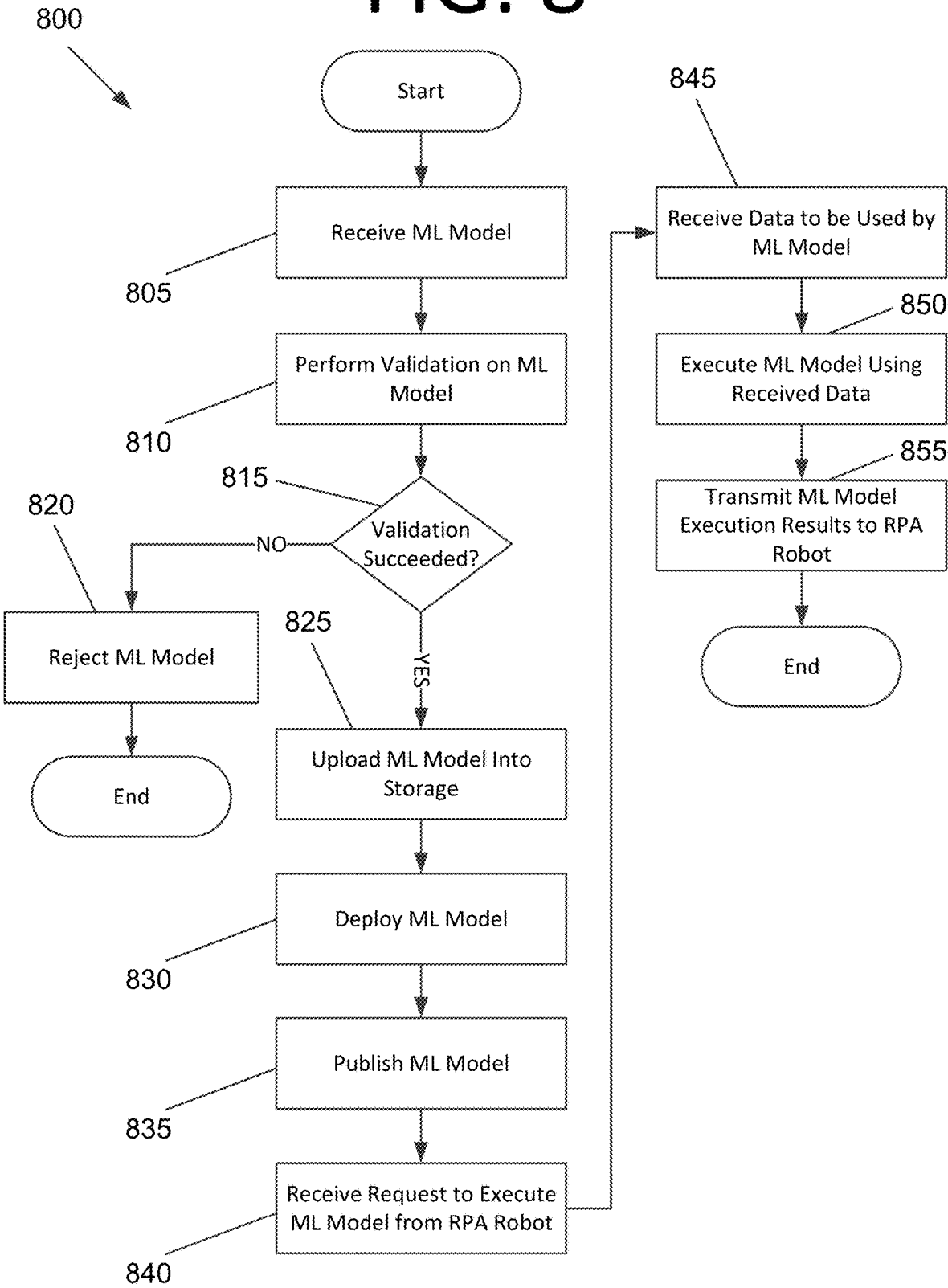
FIG. 8 is a flowchart illustrating a process for integration of heterogeneous models into RPA workflows, according to an embodiment of the present invention.

FIG. 8 is a flowchart illustrating a process 800 for integration of heterogeneous models into RPA workflows, according to an embodiment of the present invention. The process begins with receiving an ML model to be validated from a conductor application at 805. In some embodiments, the ML model is an initial version of the ML model to be validated and deployed. In certain embodiments, the ML model is received from the conductor application via a proxy that is loosely coupled with the conductor application. The proxy is configured to be decoupled from the conductor application and run independently therefrom. The proxy may be configured to tunnel requests associated with the ML model via an API gateway of a service tier.

Validation is then performed on the ML model at 810. When validation of the ML model fails at 815, the ML model is rejected at 820. However, when validation of the ML model succeeds at 815, the ML model is uploaded into storage at 825 and deployed for use by RPA robots at 830. In some embodiments, this may include performing version control on the ML model by creating and storing metadata regarding the new version of the ML model. The ML model is then published (e.g., via a REST API) at 835.

In some embodiments, the ML model is uploaded, validated, and deployed via a service tier. In certain embodiments, the service tier is configured to provide internal utility services that perform asynchronous operations, state machine management, storage abstraction and access, or any combination thereof. In some embodiments, the service tier is configured to provide a model publish service that performs CRUD operations. In certain embodiments, the service tier is configured to build images of the ML model with dependencies, build wrapper code around the ML model to create a container, push the container to a container registry, and deploy the container as an ML skill for consumption by the RPA robots.

A request is received from an RPA robot to execute the deployed ML model at 840 and data to be used by the deployed ML model is received at 845. In some embodiments, the deployed ML model is called by the RPA robot via a REST API that exposes the ML model as a service. The deployed ML model is executed using the received data at 850 and results of the ML model execution are transmitted to the RPA robot at 850.

The process steps performed in FIG. 8 may be performed by a computer program, encoding instructions for the processor(s) to perform at least part of the process(es) described in FIG. 8, in accordance with embodiments of the present invention. The computer program may be embodied on a non-transitory computer-readable medium. The computer-readable medium may be, but is not limited to, a hard disk drive, a flash device, RAM, a tape, and/or any other such medium or combination of media used to store data. The computer program may include encoded instructions for controlling processor(s) of a computing system (e.g., processor(s) 510 of computing system 500 of FIG. 5) to implement all or part of the process steps described in FIG. 8, which may also be stored on the computer-readable medium.

The computer program can be implemented in hardware, software, or a hybrid implementation. The computer program can be composed of modules that are in operative communication with one another, and which are designed to pass information or instructions to display. The computer program can be configured to operate on a general purpose computer, an ASIC, or any other suitable device.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A non-transitory computer-readable medium storing a computer program, the computer program configured to cause at least one processor to:
   receive a machine learning (ML) model from a conductor application;
   perform validation on the ML model;
   responsive to validation of the ML model succeeding:
      upload the ML model into storage,
      deploy the ML model for use by robotic process automation (RPA) robots, and
      publish the ML model by exposing the ML model as a service via an Application Programming Interface (API) that the RPA robots call during execution; and
   responsive to validation of the model failing:
      reject the ML model.

2. The non-transitory computer-readable medium of claim 1, where the computer program is further configured to cause the at least one processor to:
   receive a request from an RPA robot to execute the deployed ML model;
   receive data to be used by the deployed ML model;
   execute the deployed ML model using the received data; and
   transmit results of the executed ML model to the RPA robot.

3. The non-transitory computer-readable medium of claim 2, wherein the deployed ML model is an initial version of the ML model.

4. The non-transitory computer-readable medium of claim 1, wherein the ML model is received from the conductor application via a proxy that is loosely coupled with the conductor application, the proxy configured to be decoupled from the conductor application and run independently therefrom.

5. The non-transitory computer-readable medium of claim 4, wherein the proxy is configured to tunnel requests associated with the ML model via an Application Programming Interface (API) gateway of a service tier.

6. The non-transitory computer-readable medium of claim 1, wherein when the ML model is a new version of an existing ML model, the computer program is further configured to cause the at least one processor to:
   perform version control on the ML model by creating and storing metadata regarding the new version of the ML model.

7. The non-transitory computer-readable medium of claim 1, wherein the computer program is further configured to cause the at least one processor to:
   upload, validate, and deploy the ML model via a service tier.

8. The non-transitory computer-readable medium of claim 7, wherein the service tier is configured to provide internal utility services that perform asynchronous operations, state machine management, storage abstraction and access, or any combination thereof.

9. The non-transitory computer-readable medium of claim 7, wherein the service tier is configured to provide a model publish service that performs create, retrieve, update, and delete (CRUD) operations.

10. The non-transitory computer-readable medium of claim 7, wherein the service tier is configured to build images of the ML model with dependencies, build wrapper code around the ML model to create a container, push the container to a container registry, and deploy the container as an ML skill for consumption by the RPA robots.

11. The non-transitory computer-readable medium of claim 1, wherein the API is a Representative State Transfer (REST) API.

12. A computer-implemented method, comprising:
   receiving a machine learning (ML) model from a conductor application, by a computing system;
   performing validation on a machine learning (ML) model, by the computing system; and
   responsive to validation of the ML model succeeding:
      uploading the ML model into storage, by the computing system,
      deploying the ML model, by the computing system, for use by robotic process automation (RPA) robots, and
      publishing the ML model by exposing the ML model as a service via an Application Programming Interface (API) that the RPA robots call during execution.

13. The computer-implemented method of claim 12, further comprising:
   receiving, by the computing system, a request from an RPA robot to execute the deployed ML model;
   receiving data to be used by the deployed ML model, by the computing system;
   executing the deployed ML model using the received data, by the computing system; and
   transmitting results of the executed ML model to the RPA robot, by the computing system.

14. The computer-implemented method of claim 12, wherein
   the initial ML model is received from the conductor application via a proxy that is loosely coupled with the conductor application, the proxy configured to be decoupled from the conductor application and run independently therefrom, and
   the proxy is configured to tunnel requests associated with the initial version of the ML model via an Application Programming Interface (API) gateway of a service tier.

15. The computer-implemented method of claim 12, wherein when the ML model is a new version of an existing ML model, the method further comprises:
   performing version control on the ML model, by the computing system, by creating and storing metadata regarding the new version of the ML model.

16. The computer-implemented method of claim 12, further comprising:
uploading, validating, and deploying the ML model via a service tier, by the computing system.

17. The computer-implemented method of claim 16, wherein the service tier is configured to provide internal utility services that perform asynchronous operations, state machine management, storage abstraction and access, or any combination thereof.

18. The computer-implemented method of claim 16, wherein the service tier is configured to provide a model publish service that performs create, retrieve, update, and delete (CRUD) operations.

19. The computer-implemented method of claim 16, wherein the service tier is configured to build images of the ML model with dependencies, build wrapper code around the ML model to create a container, push the container to a container registry, and deploy the container as an ML skill for consumption by the RPA robots.

20. The computer-implemented method of claim 12, wherein the API is a Representative State Transfer (REST) API.

21. A system, comprising:
memory storing computer program instructions; and
at least one processor configured to execute the computer program instructions, wherein the computer program instructions are configured to cause the at least one processor to:
receive a machine learning (ML) model from a conductor application;
perform validation on the ML model; and
when validation of the ML model succeeds:
upload the ML model into storage,
deploy the ML model for use by robotic process automation (RPA) robots, and
publish the ML model by exposing the ML model as a service via a Representative State Transfer (REST) Application Programming Interface (API) that the RPA robots call during execution.

22. The system of claim 21, wherein the computer program instructions are further configured to cause the at least one processor to:
receive a request from an RPA robot to execute the deployed ML model;
receive data to be used by the deployed ML model;
execute the deployed ML model using the received data; and
transmit results of the executed ML model to the RPA robot.

23. The system of claim 21, wherein when the ML model is a new version of an existing ML model, the computer program instructions are further configured to cause the at least one processor to:
perform version control on the ML model by creating and storing metadata regarding the new version of the ML model.

24. The system of claim 21, wherein the computer program instructions are further configured to cause the at least one processor to:
upload, validate, and deploy the ML model via a service tier.

25. The system of claim 21, wherein the service tier is configured to provide internal utility services that perform asynchronous operations, state machine management, storage abstraction and access, or any combination thereof.

26. The system of claim 25, wherein the service tier is configured to provide a model publish service that performs create, retrieve, update, and delete (CRUD) operations.

27. The system of claim 25, wherein the service tier is configured to build images of the ML model with dependencies, build wrapper code around the ML model to create a container, push the container to a container registry, and deploy the container as an ML skill for consumption by the RPA robots.

* * * * *